(12) United States Patent
Fu et al.

(10) Patent No.: US 10,574,224 B2
(45) Date of Patent: Feb. 25, 2020

(54) DRIVE CIRCUIT OF TRANSISTOR

(71) Applicant: BYD COMPANY LIMITED, Shenzhen (CN)

(72) Inventors: Ping Fu, Shenzhen (CN); Fei Gao, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 0 days.

(21) Appl. No.: 16/110,147

(22) Filed: Aug. 23, 2018

(65) Prior Publication Data
US 2018/0367132 A1 Dec. 20, 2018

Related U.S. Application Data

(63) Continuation of application No. PCT/CN2017/074625, filed on Feb. 23, 2017.

(30) Foreign Application Priority Data

Feb. 24, 2016 (CN) .......................... 2016 1 0100870

(51) Int. Cl.
*H03K 17/081* (2006.01)
*H02H 9/04* (2006.01)
(Continued)

(52) U.S. Cl.
CPC ... *H03K 17/08104* (2013.01); *H01L 27/0255* (2013.01); *H02H 9/045* (2013.01);
(Continued)

(58) Field of Classification Search
CPC ................ H03K 17/08104; H02H 9/045
(Continued)

(56) References Cited

U.S. PATENT DOCUMENTS 5,477,414 A 12/1995 Li et al.
6,002,568 A 12/1999 Ker et al.
(Continued)

FOREIGN PATENT DOCUMENTS

CN 101562334 A 10/2009
CN 201699675 U 1/2011
(Continued)

OTHER PUBLICATIONS

The World Intellectual Property Organization (WIPO), International Search Report for PCT/CN2017/074625, dated May 27, 2017, 6 pages.

*Primary Examiner* — Zeev V Kitov
(74) *Attorney, Agent, or Firm* — Anova Law Group, PLLC

(57) ABSTRACT

The present disclosure discloses a drive circuit of a transistor, including: a high-voltage power supply and a low-voltage power supply; a high-voltage power supply domain circuit and a low-voltage power supply domain circuit, where the high-voltage power supply domain circuit is connected to the high-voltage power supply; an electrostatic discharge apparatus; a level shifter circuit, wherein the level shifter circuit includes a level detection circuit, a current limiting module, a discharge module, and a switch transistor, the level detection circuit is connected to a positive electrode of the high-voltage power supply and is separately connected to the current limiting module, the discharge module, and the high-voltage power supply domain circuit, the current limiting module is further connected to a first end of the switch transistor, the discharge module is further connected to a negative electrode of the high-voltage power supply, a control end of the switch transistor is connected to the low-voltage power supply domain circuit and a second end of the switch transistor is connected to a negative electrode of the low-voltage power supply, the current (Continued)

limiting module is configured to limit the discharged electricity when the drive circuit performs electrostatic discharge, and the discharge module is configured to form a discharge assisting path between the negative electrode of the high-voltage power supply and the first end of the switch transistor to assist electrostatic discharge of the drive circuit.

7 Claims, 4 Drawing Sheets

(51) Int. Cl.
*H02M 1/08* (2006.01)
*H03K 17/0814* (2006.01)
*H03K 17/16* (2006.01)
*H03K 19/0185* (2006.01)
*H03K 17/082* (2006.01)
*H01L 27/02* (2006.01)

(52) U.S. Cl.
CPC .......... *H02M 1/08* (2013.01); *H03K 17/0822* (2013.01); *H03K 17/08142* (2013.01); *H03K 17/163* (2013.01); *H03K 17/166* (2013.01); *H03K 19/0185* (2013.01)

(58) Field of Classification Search
USPC .......................................................... 361/56
See application file for complete search history.

(56) References Cited

U.S. PATENT DOCUMENTS

| | | | |
|---|---|---|---|
| 6,218,706 B1 | 4/2001 | Waggoner et al. | |
| 6,268,993 B1 | 7/2001 | Anderson | |
| 9,153,958 B2 | 10/2015 | Raad et al. | |
| 9,373,275 B2 | 6/2016 | Chuang et al. | |
| 9,473,116 B1* | 10/2016 | Wang | H03K 3/037 |
| 2004/0052001 A1 | 3/2004 | Crone et al. | |
| 2004/0070900 A1 | 4/2004 | Ker et al. | |
| 2004/0094779 A1 | 5/2004 | Isezaki et al. | |
| 2005/0286187 A1 | 12/2005 | Liu et al. | |
| 2008/0062595 A1* | 3/2008 | Ping | H01L 27/0266 361/56 |
| 2008/0100378 A1* | 5/2008 | Bernacchia | H02M 7/5388 327/589 |
| 2009/0189670 A1 | 7/2009 | Yang et al. | |
| 2010/0079921 A1* | 4/2010 | Fujita | G06K 19/0701 361/56 |
| 2011/0074485 A1 | 3/2011 | Yamamoto | |
| 2011/0255200 A1 | 10/2011 | Tsai et al. | |
| 2016/0079785 A1 | 3/2016 | Kinzer et al. | |

FOREIGN PATENT DOCUMENTS

| | | |
|---|---|---|
| CN | 103684397 A | 3/2014 |
| CN | 104377670 A | 2/2015 |
| CN | 104518776 A | 4/2015 |
| CN | 104600046 A | 5/2015 |
| CN | 106207953 A | 12/2016 |
| JP | 2009117999 A | 5/2009 |
| JP | 2009278406 A | 11/2009 |

* cited by examiner

DRIVE CIRCUIT OF TRANSISTOR

CROSS-REFERENCE TO RELATED APPLICATIONS

This application is a continuation application of International Application No. PCT/CN2017/074625, filed on Feb. 23, 2017, which claims priority to Chinese Patent Application No. 201610100870.5, filed with the Chinese Patent Office on Feb. 24, 2016, content of all of which is incorporated by reference in its entirety.

BACKGROUND

Technical Field

This application relates to the field of drive circuit technologies and, in particular, to a drive circuit of a transistor.

Related Art

A high-voltage transistor drive chip is mainly used to drive a power device such as a MOSFET (Metal-Oxide-Semiconductor Field-Effect Transistor) or an IGBT (Insulated Gate Bipolar Transistor), and is generally applied to fields such as industrial and household appliance inverters. Because the high-voltage transistor drive chip has a high-voltage power supply domain and a low-voltage power supply domain, static electricity between the power supply domains needs to be discharged by using a high-voltage device. However, when the withstand voltage of the device is increased, an ESD (Electrostatic Discharge) capability of the device is decreased. Therefore, ESD capabilities of the high-voltage power supply domain and the low-voltage power supply domain are not strong.

SUMMARY

This application is aimed to at least resolve one of the technical problems in the related technology to some extent.

In view of this, the objective of this application is to provide a drive circuit of a transistor. The drive circuit of the transistor has an advantage of a strong anti-static electricity capability, thereby further improving the stability and the reliability of the drive circuit of the transistor.

To achieve the foregoing objective, embodiments of this application disclose a drive circuit of a transistor, including: a high-voltage power supply and a low-voltage power supply; a high-voltage power supply domain circuit and a low-voltage power supply domain circuit, where the high-voltage power supply domain circuit is connected to the high-voltage power supply, and the low-voltage power supply domain circuit is connected to the low-voltage power supply; an electrostatic discharge apparatus, where the electrostatic discharge apparatus is separately disposed between electrodes of the high-voltage power supply, between electrodes of the low-voltage power supply, and between a positive electrode of the high-voltage power supply and a negative electrode of the low-voltage power supply; a level shifter circuit, where the level shifter circuit includes a level detection circuit, a current limiting module, a discharge module, and a switch tube, where the level detection circuit is connected to the positive electrode of the high-voltage power supply and is separately connected to the current limiting module, the discharge module, and the high-voltage power supply domain circuit, the current limiting module is further connected to a first end of the switch tube, the discharge module is further connected to a negative electrode of the high-voltage power supply, a control end of the switch tube is connected to the low-voltage power supply domain circuit and a second end of the switch tube is connected to the negative electrode of the low-voltage power supply, the current limiting module is configured to limit the discharged electricity when the drive circuit performs electrostatic discharge, and the discharge module is configured to form a discharge assisting path between the negative electrode of the high-voltage power supply and the first end of the switch tube to assist electrostatic discharge of the drive circuit.

In the drive circuit of the transistor according to the embodiments of this application, a current limiting module is added in a level shifter circuit, to increase the internal resistance of a path on which electrostatic discharge is performed by using the level shifter circuit, so that when the electrostatic discharge is performed, the current on the path is limited, which prevents the level shifter circuit from being damaged. When the voltage reaches a trigger voltage of an electrostatic discharge apparatus (such as a high-voltage ESD device), the electrostatic discharge apparatus is started, to discharge a large part of energy, to further protect the drive circuit of the transistor. In addition, a discharge module is increased in the level shifter circuit, to provide a low-resistance path from a negative electrode of a high-voltage power supply to a drain of a switch tube. Therefore, an electrostatic discharge path is increased to shunt the electrostatic discharge, and the discharge module may restrain the potential of a level detection circuit, to prevent the potential from being lower than the voltage of the negative electrode of the high-voltage power supply. The drive circuit of the transistor has a strong anti-static electricity capability, thereby further improving the stability and the reliability of the drive circuit of the transistor.

DETAILED DESCRIPTION

The following describes embodiments of the present disclosure in detail, and examples of the embodiments are shown in the accompanying drawings. Same or similar numbers always represent same or similar elements or elements with same or similar functions. The following embodiments described with reference to the accompanying drawings are exemplary, and are used to explain the present disclosure, but should not be understood as a limitation to the present disclosure.

Figure 7:
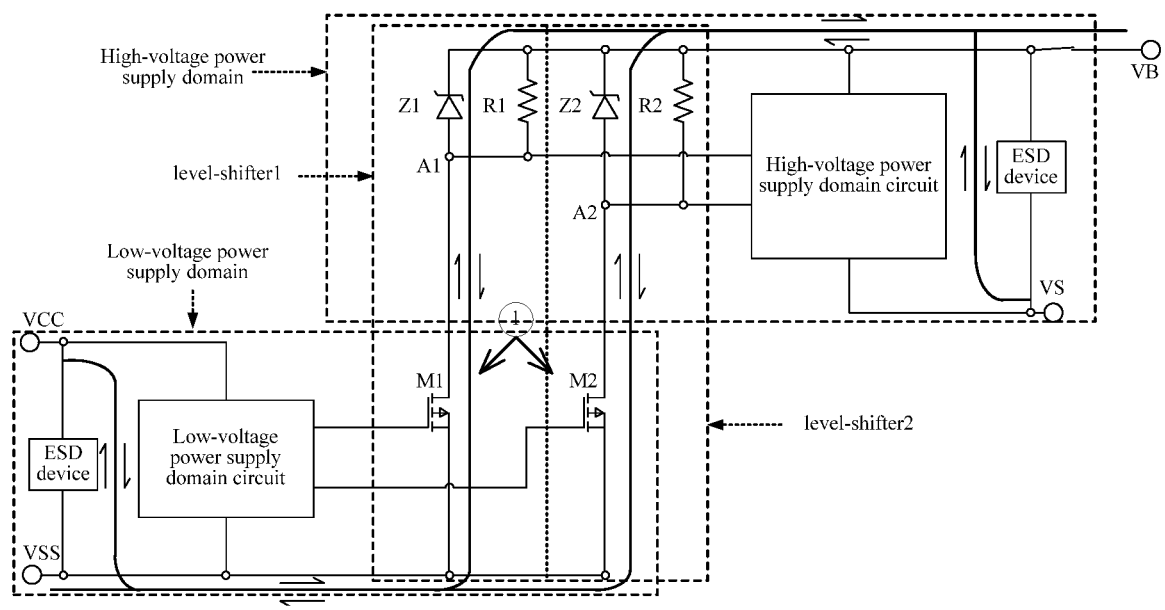
FIG. 7 is a circuit diagram of a drive circuit of a transistor in the related technology.

As shown in FIG. 7, the chip includes two power supply domains: a low-voltage power supply domain (VCC is a low-voltage power supply and VSS is a low-voltage ground) and a high-voltage power supply domain (VB is a high-voltage power supply and VS is a high-voltage ground). The two power supply domains are connected together by using a level-shifter circuit (level shifter, and inside of FIG. 7 includes a level-shifter 1 and a level-shifter 2 that are independent and in a same structure) and a high-voltage ESD device. Inside of an independent power supply domain, and power supply grounded VB-VS and VCC-VSS include independent ESD devices (which are commonly a diode, a triode, a CMOS tube, and the like), used to perform ESD.

The level-shifter mainly includes: a DMOS (M1 and M2 in FIG. 7), a DMOS source device (a source is grounded in FIG. 7), and a DMOS drain detection circuit (formed by detection resistors R1 and R2 and voltage stabilizing tubes Z1 and Z2 in FIG. 7). Voltages on the detection resistors R1 and R2 are changed by controlling on and off of the DMOS-M1 and the DMOS-M2, to shift a low-voltage signal to a high-voltage signal.

When static electricity exists between the high-voltage power supply domain and the low-voltage power supply domain, the static electricity is discharged by using a level-shifter circuit. An ESD capability of a circuit device is used to discharge electrostatic energy, but an ESD capability of the DMOS is weak and easy to damage. Therefore, an entire ESD capability of the chip is not strong.

The following describes a drive circuit of a transistor according to the embodiments of the present disclosure with reference to the accompanying drawings.

Figure 1:
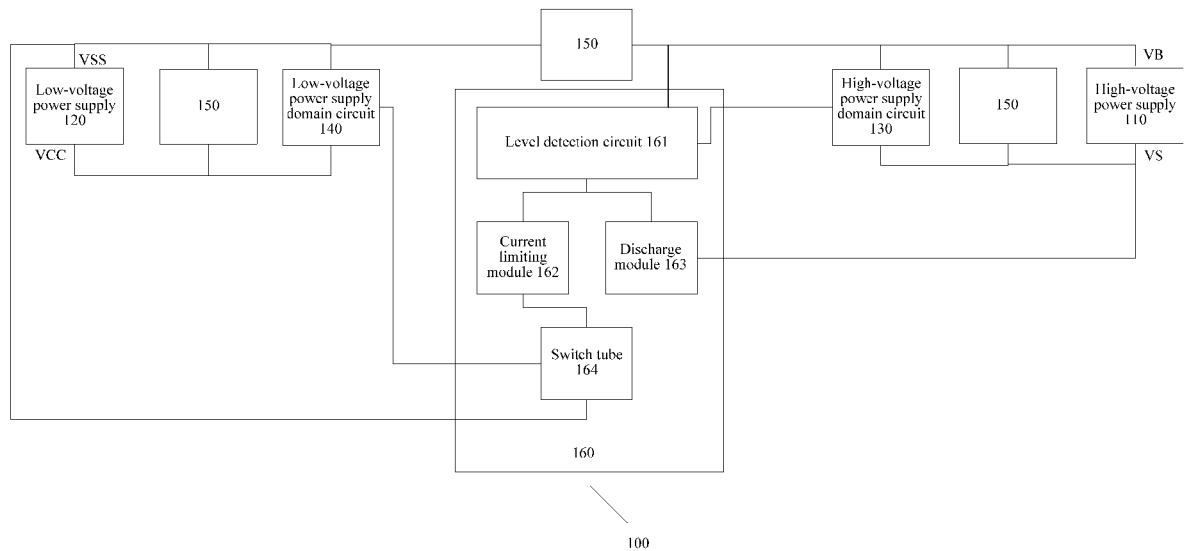
FIG. 1 is a structural diagram of a drive circuit of a transistor according to an embodiment of the present disclosure.
Figure 2:
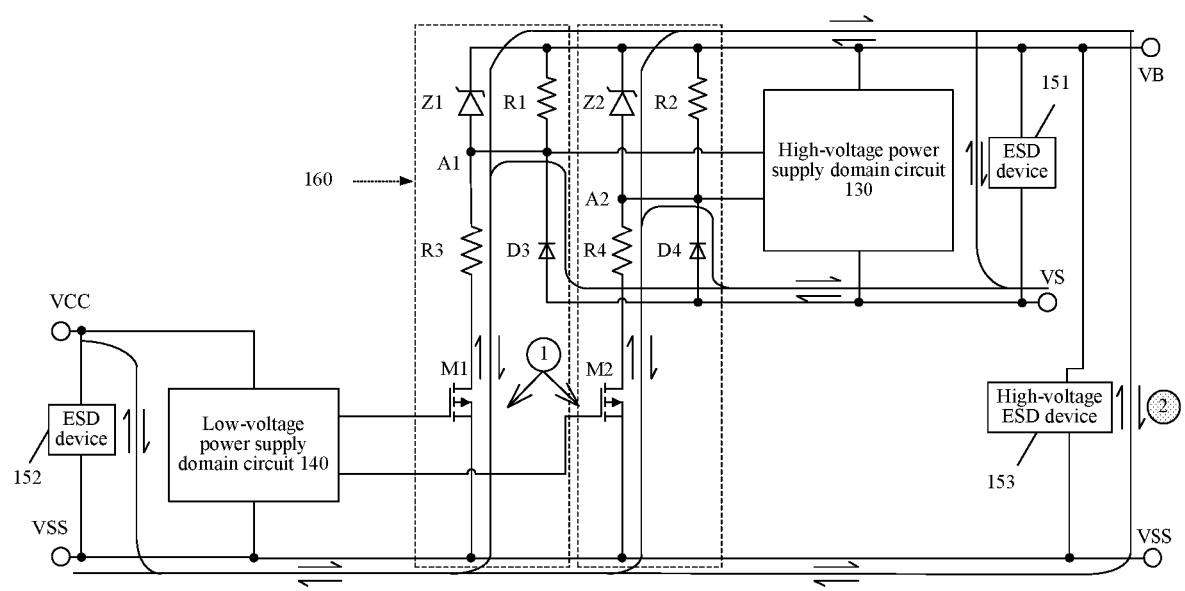
FIG. 2 is a circuit diagram of a drive circuit of a transistor according to a first embodiment of the present disclosure.

FIG. 1 is structural block diagram of a drive circuit of a transistor according to an embodiment of the present disclosure. FIG. 2 is a circuit diagram of a drive circuit of a transistor according to an embodiment of the present disclosure. As shown in FIG. 1, and with reference to FIG. 2, a drive circuit 100 of a transistor according to an embodiment of the present disclosure includes: a high-voltage power supply 110, a low-voltage power supply 120, a high-voltage power supply domain circuit 130, a low-voltage power supply domain circuit 140, an electrostatic discharge apparatus 150, and a level shifter circuit 160.

It may be understood that, high-voltage and low-voltage in the high-voltage power supply and the low-voltage power supply are used to represent two power supplies with different voltages. Likewise, high-voltage and low-voltage in the high-voltage power supply domain circuit and the low-voltage power supply domain circuit are used to represent two power supply domain circuits with different voltages. For example, the voltage of the high-voltage power supply may be 20 V, the voltage of the low-voltage power supply may be 10 V, the voltage of the high-voltage power supply domain circuit may be 20 V, and the voltage of the low-voltage power supply domain circuit may be 10 V; or the voltage of the high-voltage power supply may be 10 V, the voltage of the low-voltage power supply may be 7 V, the voltage of the high-voltage power supply domain circuit may be 10 V, and the voltage of the low-voltage power supply domain circuit may be 7 V. The high-voltage power supply domain circuit may refer to a general circuit works in the high-voltage power supply domain, and the low-voltage power supply domain circuit may refer to a general circuit works in the low-voltage power supply domain.

In an embodiment, the high-voltage power supply domain circuit 130 is connected to the high-voltage power supply 110, and the low-voltage power supply domain circuit 140 is connected to the low-voltage power supply 120. The electrostatic discharge apparatus 150 is separately disposed between electrodes of the high-voltage power supply 110 (that is: between a positive electrode VB and a negative electrode VS), between electrodes of the low-voltage power supply 120 (that is: between a positive electrode VCC and a negative electrode VSS), and between the positive electrode VB of the high-voltage power supply 110 and the negative electrode VSS of the low-voltage power supply 120. The level shifter circuit 160 includes a level detection circuit 161, a current limiting module 162, a discharge module 163, and a switch tube 164. In an embodiment, a first end of the level detection circuit 161 is connected to the positive electrode VB of the high-voltage power supply 110 and a second end of the level detection circuit 161 is separately connected to a first end of the current limiting module 162, a first end of the discharge module 163, and the high-voltage power supply domain circuit 130, a second end of the current limiting module 162 is connected to a first end of the switch tube 164, a second end of the discharge module 163 is connected to the negative electrode VS of the high-voltage power supply 110, a control end of the switch tube 164 is connected to the low-voltage power supply domain circuit 140 and a second end of the switch tube 164 is connected to the negative electrode VSS of the low-voltage power supply 120, the current limiting module 162 is configured to limit the discharged current when the drive circuit performs electrostatic discharge, and the discharge module 163 is configured to form a discharge assisting path between the negative electrode VS of the high-voltage power supply 110 and the first end of the switch tube 164 to assist electrostatic discharge of the drive circuit.

As an example, as shown in FIG. 1 and FIG. 2, the level detection circuit 161 includes a voltage stabilizing transistor Z1 and a first resistor R1, a cathode of the voltage stabilizing transistor Z1 is connected to the positive electrode VB of the high-voltage power supply 110, an anode of the voltage stabilizing transistor Z1 is connected to the high-voltage power supply domain circuit 130, that is: the anode of the voltage stabilizing transistor Z1 is connected to the high-voltage power supply domain circuit 130 by using a detection point A1, and the first resistor R1 is connected to the voltage stabilizing transistor Z1 in parallel. The current limiting module 162 includes a current limiting resistor R3, one end of the current limiting resistor R3 is connected to the anode of the voltage stabilizing transistor Z1, and the other end of the current limiting resistor R3 is connected to the first end of the switch transistor 164. The discharge module 163 includes a first diode D3, a cathode of the first diode D3 is connected to the anode of the voltage stabilizing transistor Z1, and an anode of the first diode D3 is connected to the negative electrode VS of the high-voltage power supply 110.

Further, as shown in FIG. 2, the switch transistor 164 is a second MOS transistor M1. Further, the control end of the switch transistor 164 is a gate G of the second MOS transistor M1, the first end is a drain D of the second MOS transistor M1, and the second end is a source S of the second MOS transistor M1.

With reference to FIG. 2, the electrostatic discharge apparatus 150 includes: a third electrostatic discharge device 151, a fourth electrostatic discharge device 152, and a fifth electrostatic discharge device 153. The third electrostatic discharge device 151 and the fourth electrostatic discharge device 152 are ESD devices. For example, the fifth electrostatic discharge device 153 is a high-voltage ESD device (High Voltage Isolation Junction) shown in FIG. 2. The third electrostatic discharge device 151 is an ESD device disposed between electrodes of the high-voltage power supply 110, that is, disposed between the positive electrode VB and the negative electrode VS of the high-voltage power supply 110. The fourth electrostatic discharge device 152 is an ESD device disposed between electrodes of the low-voltage power supply 110, that is, disposed between the positive electrode VCC and the negative electrode VSS of the low-voltage power supply 120. The fifth electrostatic discharge device 153 is a high-voltage ESD device 153 disposed between the positive electrode VB of the high-voltage power supply 110 and the negative electrode VS S of the low-voltage power supply 120, that is, disposed between the positive electrode VB of the high-voltage power supply 110 and the negative electrode VSS of the low-voltage power supply 120.

In addition, with reference to FIG. 1, FIG. 2 shows a drive circuit 100 of a transistor including two level shifter circuits 160 that are connected in parallel and in a same structure. The other level shifter circuit 160 is formed by a voltage stabilizing transistor Z2, a resistor R2, a resistor R4, a diode D4, and a first MOS transistor M2. Details are not provided herein again.

After the structure of the drive circuit 100 of the transistor of this embodiment of the present disclosure is described, the following describes the working principle of the drive circuit 100 of the transistor of this embodiment of the present disclosure.

With reference to FIG. 1, as shown in FIG. 2, the high-voltage power supply domain circuit 130 is connected to the low-voltage power supply domain circuit 140 by using the level shifter circuit 160, and at the same time, the high-voltage power supply domain circuit 130 is connected to the low-voltage power supply domain circuit 140 by using a high-voltage ESD device. The level shifter circuit 160 mainly performs level shifting, to shift a signal in a low-voltage region to a high-voltage region, so as to implement transmission of the signal. In FIG. 2, there are two level shifter circuits 160 connected in parallel. A gate signal of a high-voltage device DMOS (Double-Diffused MOSFET), that is, a second MOS transistor M1, of one of the level shifter circuits 160 is generated by the low-voltage power supply domain circuit 140, a source of the second MOS transistor M1 is connected to the negative electrode VSS of the low-voltage power supply 120, a drain of the second MOS transistor M1 is connected to one end of the resistor R3, the other end of the resistor R3 is connected to the anode of the voltage stabilizing transistor Z1, the cathode of the voltage stabilizing transistor Z1 is connected to the positive electrode VB of the high-voltage power supply 110, the first resistor R1 is connected to the voltage stabilizing transistor Z1 in parallel, the anode of the voltage stabilizing transistor Z1 is a detection point A1, an electric signal of the detection point A1 is used as an input signal of the high-voltage power supply domain circuit 130, the cathode of the first diode D3 is connected to the detection point A1, and the anode of the first diode D3 is connected to the negative electrode VS of the high-voltage power supply 110. A gate signal of a high-voltage device DMOS, that is, a first MOS transistor M2, of the other level shifter circuit 160 is generated by the low-voltage power supply domain circuit 140, a source of the first MOS transistor M2 is connected to the negative electrode VSS of the low-voltage power supply 120, a drain of the first MOS transistor M2 is connected to one end of the resistor R4, the other end of the resistor R4 is connected to the anode of the voltage stabilizing transistor Z2, the cathode of the voltage stabilizing transistor Z2 is connected to the positive electrode VB of the high-voltage power supply 110, the resistor R2 is connected to the voltage stabilizing transistor Z2 in parallel, the anode of the voltage stabilizing transistor Z2 is a detection point A2, an electric signal of the detection point A2 is used as an input signal of the high-voltage power supply domain circuit 130, a cathode of the diode D4 is connected to the detection point A2, and an anode of the diode D4 is connected to the negative electrode VS of the high-voltage power supply 110.

For one of the level shifter circuits 160, by controlling the second MOS transistor M1 of the high-voltage device DMOS, a changed voltage signal may be generated on the first resistor R1 connected to the drain of the second MOS transistor M1, and input to the high-voltage power supply domain circuit 130 for processing, thereby implementing shifting from a low-voltage signal to a high-voltage signal. In addition, the first diode D3 provides a low-resistance path from the negative electrode VS of the high-voltage power supply 110 to the drain of the second MOS transistor M1. Therefore, a discharge path from the negative electrode VS of the high-voltage power supply 110 to the low-voltage power supply domain not only includes: the discharge path VS→VB→DMOS/high-voltage ESD device→VSS→VCC, but also includes the discharge assisting path VS→DMOS→VSS→VCC. This helps to shunt the ESD. Meanwhile, the first diode D3 may restrain the potential of the detection point A1, to prevent the potential of the detection point A1 from being lower than the voltage of the negative electrode VS of the high-voltage power supply 110. The voltage stabilizing transistor Z1 is connected to the first resistor R1 in parallel, and may restrain the voltages at two ends of the resistor, to prevent the voltages from exceeding the power supply range of the high-voltage power supply domain and damaging the chip. The current limiting resistor R3 may limit the current of the path of the high-voltage device DMOS when performing electrostatic discharge, so that the second MOS transistor M1 of the high-voltage device DMOS cannot be easily damaged. Meanwhile, some voltages may be superposed on the drain of the second MOS transistor M1, so that when the voltage of the positive electrode VB of the high-voltage power supply 110 reaches a trigger voltage of the high-voltage ESD device 153, the high-voltage ESD device 153 is triggered, and a large part of static electricity may be discharged by using the high-voltage ESD device 153, to protect the drive circuit 100 of the transistor. The other level shifter circuit is similar, and details are not described herein.

The high-voltage ESD device 153 is between the positive electrode VB of the high-voltage power supply 110 and the negative electrode VSS of the low-voltage power supply 120, and similar to a reversed high-voltage diode, and has a higher withstand voltage and a strong over-current capability. When static electricity exists between two power supply domains, the high-voltage ESD device 153 needs to be triggered as much as possible. This helps to discharge the static electricity, and protect the drive circuit 100 of the transistor.

For one of the level shifter circuits 160, when electrostatic discharge is performed, the second MOS transistor M1 of the high-voltage device DMOS is preferentially started due to a coupling effect. When the current flows through the first resistor R1, the current limiting resistor R3 generates a voltage, and when a drain voltage of the second MOS transistor M1 and the sum of voltages on the first resistor R1 and the current limiting resistor R3 reach the trigger voltage of the high-voltage ESD device 153, the high-voltage ESD device 153 is triggered, to discharge a large part of energy. In this way, discharge paths of the second MOS transistor M1 and the high-voltage ESD device 153 take effect at the same time, the second MOS transistor M1 discharges a small part of energy, and the high-voltage ESD device 153 discharges a large part of energy. That is, when electrostatic discharge is performed, the path is discharged as a secondary electrostatic discharge path by using the high-voltage device DMOS of the level shifter circuit 160, and discharged as a main electrostatic discharge path by using the high-voltage ESD device 153. The two discharge manners act together, which greatly improves the high voltage, and further greatly improves an electrostatic discharge capability of the drive circuit 100 of the transistor. The other level shifter circuit is similar, and details are not described herein.

In the drive circuit of the transistor according to the embodiments of the present disclosure, a current limiting module is added in a level shifter circuit, to increase the internal resistance of a path on which electrostatic discharge is performed by using the level shifter circuit, so that when the electrostatic discharge is performed, the current on the path is limited, which prevents the level shifter circuit from being damaged. When the voltage reaches a trigger voltage of an electrostatic discharge apparatus (such as a high-voltage ESD device), the electrostatic discharge apparatus is started, to discharge a large part of energy, to further protect the drive circuit of the transistor. In addition, a discharge module is increased in the level shifter circuit, to provide a low-resistance path from a negative electrode of a high-voltage power supply to a drain of a switch transistor. Therefore, an electrostatic discharge path is increased to shunt the electrostatic discharge, and the discharge module may restrain the potential of a level detection circuit, to prevent the potential from being lower than the voltage of the negative electrode of the high-voltage power supply. The drive circuit of the transistor has a strong anti-static electricity capability, thereby further improving the stability and the reliability of the drive circuit of the transistor.

Figure 3:
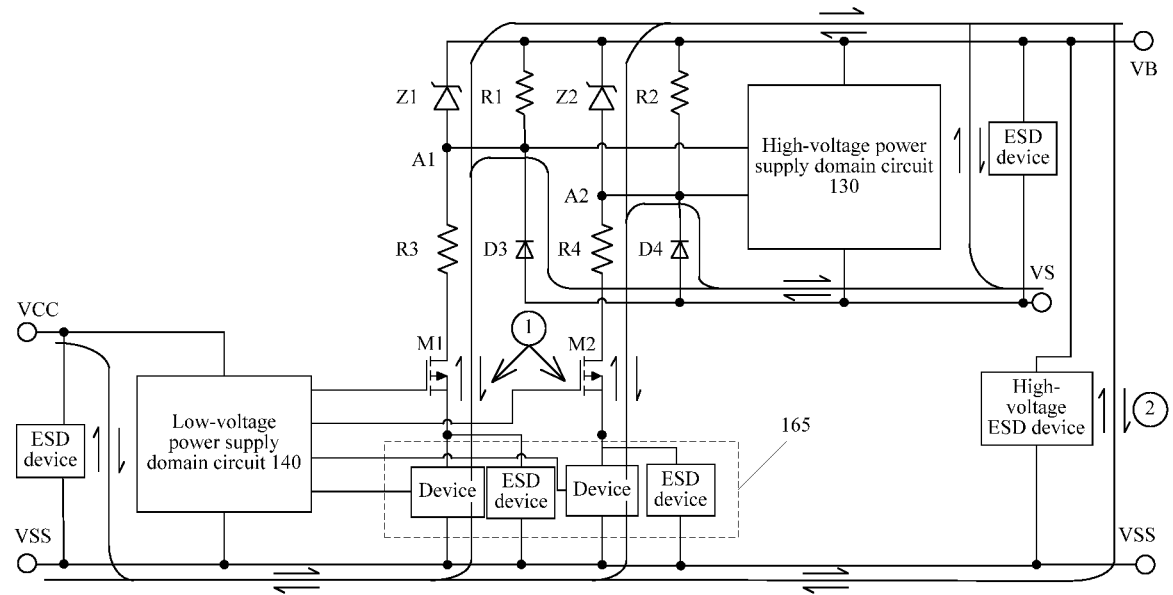
FIG. 3 is a circuit diagram of a drive circuit of a transistor according to a second embodiment of the present disclosure.

In an embodiment of the present disclosure, with reference to FIG. 1, as shown in FIG. 3, the drive circuit 100 of the transistor further includes: a protective circuit 165 (that is: a device and an ESD device), and the protective circuit 170 is disposed between the second end of the switch transistor 164 and the negative electrode VSS of the low-voltage power supply 120. That is, a source of the high-voltage device DMOS is connected to the negative electrode VSS of the low-voltage power supply 120 by using the device, and the ESD device is connected to the device in parallel. For example, the source of the second MOS transistor M1 is further connected to the negative electrode VSS of the low-voltage power supply 120 by connecting to the device and the ESD device connected to the device in parallel. When the electrostatic discharge is performed from the high-voltage power supply domain to the low-voltage power supply domain, a path of the high-voltage device DMOS is preferentially started due to a coupling effect. Because the source of the second MOS transistor M1 of the high-voltage device DMOS is connected to the device, the source has a higher voltage. When the voltage exceeds a trigger voltage of the ESD device connected to the device in parallel, the ESD device is started, and ESD energy is rapidly discharged to the negative electrode VSS of the low-voltage power supply 120, to prevent the high-voltage device DMOS and the device from being damaged, and also increase an over ESD current capability of the path of the high-voltage device DMOS.

Figure 4:
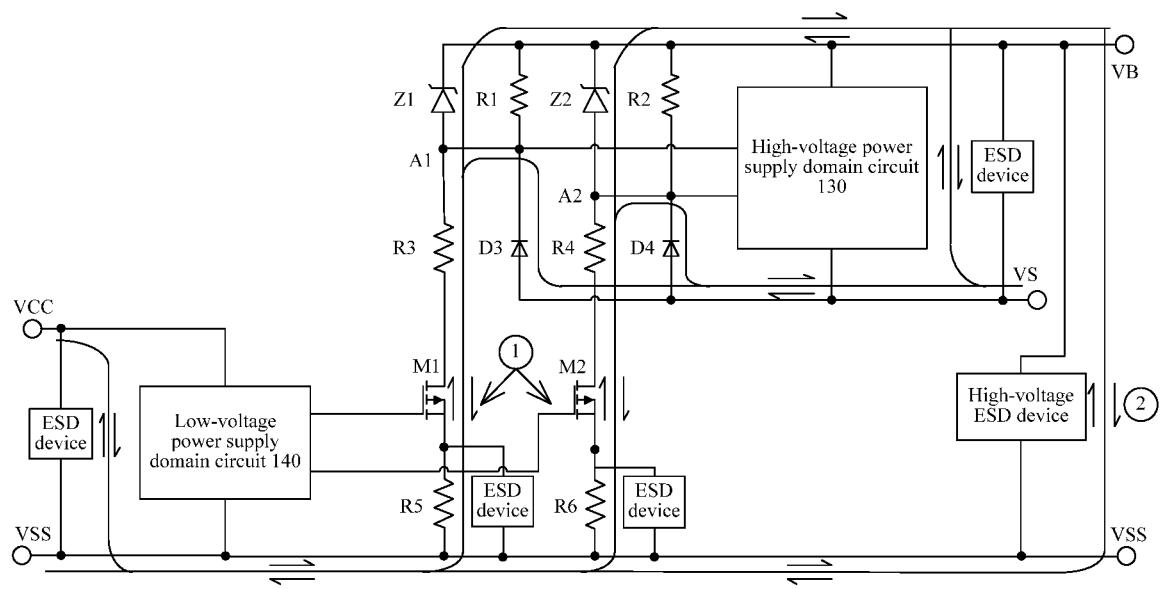
FIG. 4 is a circuit diagram of a drive circuit of a transistor according to a third embodiment of the present disclosure.

As an example, as shown in FIG. 4, the protective circuit includes: a second resistor and a first electrostatic discharge device, such as a second resistor R5 and an ESD device, or a second resistor R6 and an ESD device. The second resistor R5 and the ESD device are used as an example. The second resistor R5 is connected to the ESD device in parallel, one end of the second resistor R5 is connected to the second end of the switch transistor 164, and the other end of the second resistor R5 is connected to the negative electrode VSS of the low-voltage power supply 120. The first electrostatic discharge device is connected to the second resistor R5 in parallel. A gate signal of the high-voltage device DMOS is generated by the low-voltage power supply domain circuit 140, the source is further connected to the negative electrode VSS of the low-voltage power supply 120 by connecting to the resistor R5 and the ESD device connected to the resistor in parallel, and the second resistor R5 is connected to the ESD device in parallel. When the electrostatic discharge is performed from the high-voltage power supply domain to the low-voltage power supply domain, a path of the high-voltage device DMOS is preferentially started due to a coupling effect. Because the source of the second MOS transistor M1 of the high-voltage device DMOS is connected to the ESD device, the source has a higher voltage. When the voltage of the source of the second MOS transistor M1 exceeds a trigger voltage of the ESD device connected to the second resistor R5 in parallel, the ESD device is started, and ESD energy is rapidly discharged to the negative electrode VSS of the low-voltage power supply 120, to prevent the high-voltage device DMOS and the ESD device from being damaged, and also increase an over ESD current capability of the path of the high-voltage device DMOS. The second resistor R5 may limit the current of the ESD path, and also limit the switch current of the high-voltage device DMOS during normal work, to reduce the switch power consumption.

Figure 5:
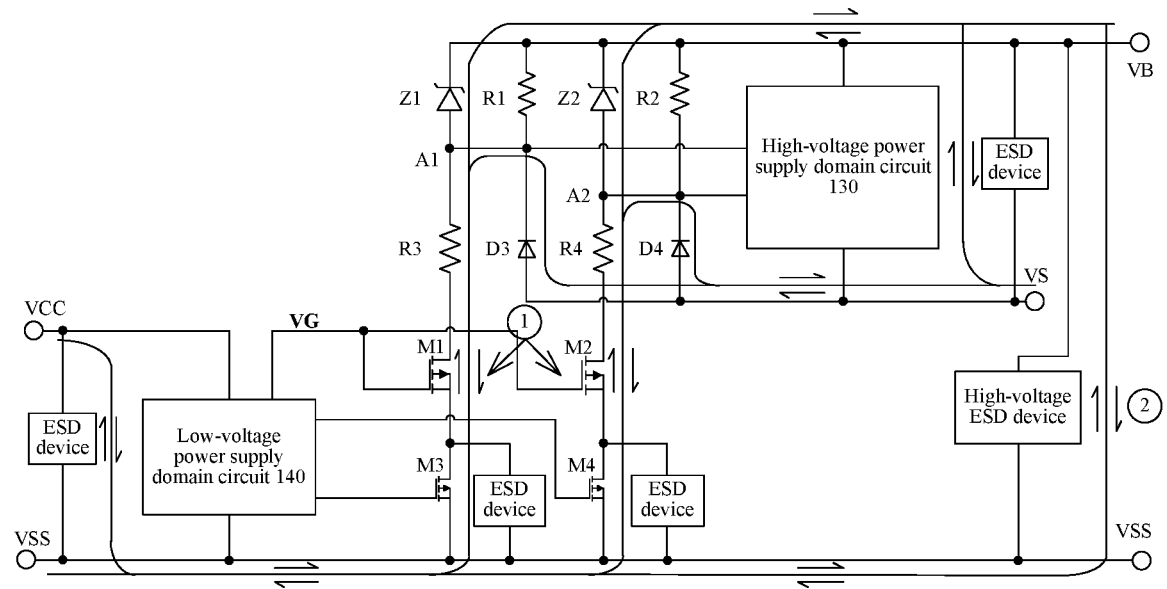
FIG. 5 is a circuit diagram of a drive circuit of a transistor according to a fourth embodiment of the present disclosure.

In another example of the present disclosure, as shown in FIG. 5, the protective circuit includes: a high-voltage device DMOS (such as a first MOS transistor M3 or a first MOS transistor M4) and a second electrostatic discharge device (such as an ESD device). The first MOS transistor M3 and the ESD device are used as an example. A gate of the first MOS transistor M3 is connected to the low-voltage power supply domain circuit 140, a drain of the first MOS transistor M3 is connected to the second end of the switch transistor 164, and a source of the first MOS transistor M3 is connected to the negative electrode VSS of the low-voltage power supply 120. One end of the second electrostatic discharge device is connected to the drain of the first MOS transistor M3, and the other end of the second electrostatic discharge device is connected to the source of the first MOS transistor M3. A gate of the first MOS transistor of the high-voltage device DMOS is connected to a constant VG. The voltage of the source is changed by controlling the first MOS transistor M3, to control the switch of the first MOS transistor of the high-voltage device DMOS. The first MOS transistor M3 is connected to the ESD device in parallel, and when the electrostatic discharge is performed from the high-voltage power supply domain to the low-voltage power supply domain, a path of the first MOS transistor of the high-voltage device DMOS is preferentially started due to a coupling effect. Because the source of the first MOS transistor M1 of the high-voltage device DMOS is connected to the ESD device, the source has a higher voltage. When the source of the voltage first MOS transistor M1 exceeds a trigger voltage of the ESD device connected to the first MOS transistor M1 in parallel, the ESD device is started, and ESD energy is rapidly discharged to the negative electrode VSS to the low-voltage power supply 120, to prevent the DMOS from being damaged, and also increase an over ESD current capability of the path of the DMOS.

Figure 6:
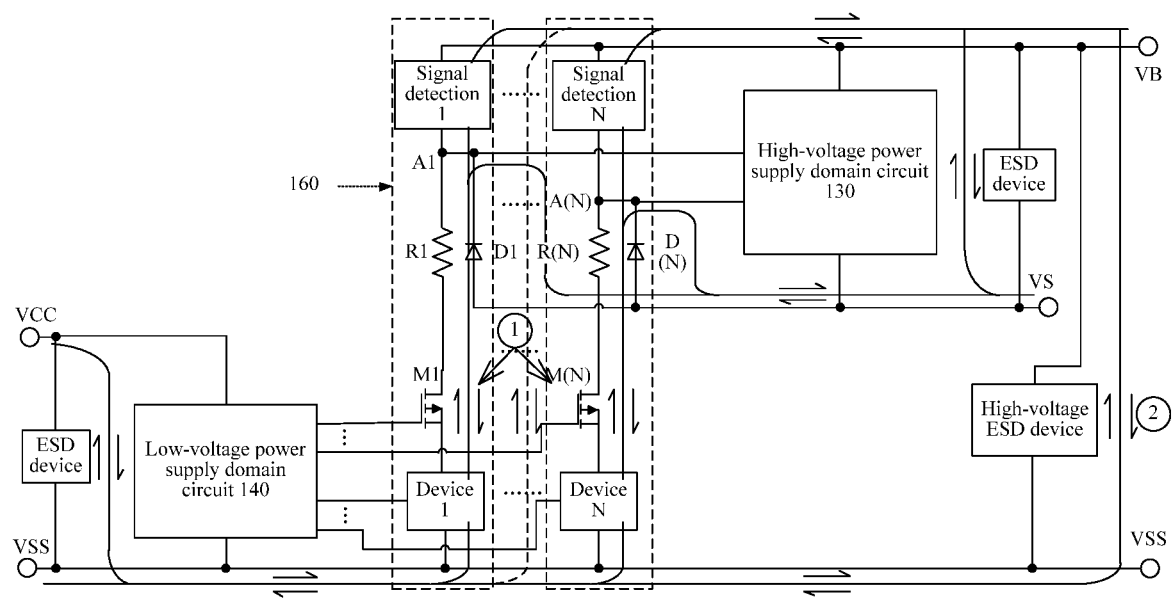
FIG. 6 is a circuit diagram of a drive circuit of a transistor according to a fifth embodiment of the present disclosure.

As shown in FIG. 6, the level shifter circuit 160 includes one or more level shifter circuits connected in parallel. FIG. 6 shows a drive circuit of a transistor including N level shifter circuits 160, and N is a positive integer.

The drive circuit of the transistor according to this embodiment of the present disclosure has an advantage of a strong anti-static electricity capability, thereby further improving the stability and the reliability of the drive circuit of the transistor.

In the description of this specification, the description of the reference terms "an embodiment", "some embodiments", "example", "specific example", "some examples" or the like means that specific features, structures, materials, or characteristics described with reference to the embodiment or example are included in at least one embodiment or example of the present disclosure. In addition, the terms "first" and "second" are merely used to describe the objective, but should not be understood as indicating or implying relative importance or implicitly indicating the quantity of the indicated technical features. Therefore, the feature limited with "first" and "second" may explicitly indicate or implicitly include at least one of the features. In the description of the present disclosure, "multiple" means at least two, such as two or three, unless being additionally specifically limited.

Although the foregoing has shown and described the embodiments of the present disclosure, it may be understood that, the foregoing embodiments are exemplary, and should not be understood as limitations to the present disclosure. A person of ordinary skill in the art may make a change, modification, replacement, and variation to the foregoing embodiments.

What is claimed is:

1. A drive circuit of a transistor, comprising:
   a high-voltage power supply and a low-voltage power supply;
   a circuit of a high-voltage power supply domain and a circuit of a low-voltage power supply domain circuit, wherein the high-voltage power supply domain circuit is connected to the high-voltage power supply, and the low-voltage power supply domain circuit is connected to the low-voltage power supply;
   an electrostatic discharge apparatus, wherein the electrostatic discharge apparatus is separately disposed between electrodes of the high-voltage power supply, between electrodes of the low-voltage power supply, and between a positive electrode of the high-voltage power supply and a negative electrode of the low-voltage power supply;
   a level shifter circuit, wherein the level shifter circuit comprises a level detection circuit, a current limiting module, a discharge module, and a switch transistor; the level detection circuit is connected to the positive electrode of the high-voltage power supply and is separately connected to the current limiting module, the discharge module, and the high-voltage power supply domain circuit; the current limiting module is further connected to a first end of the switch transistor; the discharge module is further connected to a negative electrode of the high-voltage power supply; a control end of the switch transistor is connected to the low-voltage power supply domain circuit and a second end of the switch transistor is connected to the negative electrode of the low-voltage power supply, the current limiting module is configured to limit the discharged current when the drive circuit performs electrostatic discharge, and the discharge module is configured to form a discharge assisting path between the negative electrode of the high-voltage power supply and the first end of the switch transistor to assist electrostatic discharge of the drive circuit;
   a protective circuit, wherein the protective circuit is disposed between the second end of the switch transistor and the negative electrode of the low-voltage power supply,
   wherein the protective circuit comprises:
   a second resistor, wherein one end of the second resistor is connected to the second end of the switch transistor, and the other end of the second resistor is connected to the negative electrode of the low-voltage power supply; and
   a first electrostatic discharge device, wherein the first electrostatic discharge device is connected to the second resistor in parallel.

2. The drive circuit of the transistor according to claim 1, wherein:
   the level detection circuit comprises a voltage stabilizer and a first resistor, a cathode of the voltage stabilizer is connected to the positive electrode of the high-voltage power supply, an anode of the voltage stabilizer is connected to the high-voltage power supply domain circuit, and the first resistor is connected to the voltage stabilizer in parallel;
   the current limiting module comprises a current limiting resistor, one end of the current limiting resistor is connected to the anode of the voltage stabilizer, and the other end of the current limiting resistor is connected to the first end of the switch transistor; and
   the discharge module comprises a first diode, a cathode of the first diode is connected to the anode of the voltage stabilizer, and an anode of the first diode is connected to the negative electrode of the high-voltage power supply.

3. The drive circuit of the transistor according to claim 1, wherein the protective circuit further comprises:
   a first MOS transistor, wherein a gate of the first MOS transistor is connected to the low-voltage power supply domain circuit, a drain of the first MOS transistor is connected to the second end of the switch transistor, and source of the first MOS transistor is connected to the negative electrode of the low-voltage power supply; and
   a second electrostatic discharge device, wherein one end of the second electrostatic discharge device is connected to the drain of the first MOS transistor, and the other end of the second electrostatic discharge device is connected to the source of the first MOS transistor.

4. The drive circuit of the transistor according to claim 1, wherein the level shifter circuit comprises one or more level shifter circuits connected in parallel.

5. The drive circuit of the transistor according to claim 2, wherein the switch transistor is a second MOS transistor, the control end is a gate of the second MOS transistor, the first end is a drain of the second MOS transistor, and the second end is a source of the second MOS transistor.

6. The drive circuit of the transistor according to claim 1, wherein the electrostatic discharge apparatus comprises:
   a third electrostatic discharge device, wherein the third electrostatic discharge device is disposed between electrodes of the high-voltage power supply;
   a fourth electrostatic discharge device, wherein the fourth electrostatic discharge device is disposed between electrodes of the low-voltage power supply; and a fifth electrostatic discharge device, wherein the fifth electrostatic discharge device is disposed between the positive electrode of the high-voltage power supply and the negative electrode of the low-voltage power supply.

7. The drive circuit of the transistor according to claim 6, wherein the fifth electrostatic discharge device is a high-voltage ESD device.

\* \* \* \* \*